United States Patent [19]

Swanson

[11] Patent Number: 4,680,559
[45] Date of Patent: Jul. 14, 1987

[54] RF SPLITTER CIRCUIT
[75] Inventor: Hilmer I. Swanson, Quincy, Ill.
[73] Assignee: Harris Corporation, Melbourne, Fla.
[21] Appl. No.: 711,627
[22] Filed: Mar. 14, 1985
[51] Int. Cl.[4] .............................................. H03H 7/48
[52] U.S. Cl. .................................. 333/100; 333/24 R
[58] Field of Search ............... 333/124, 131, 117, 118, 333/119, 100, 112, 32, 24 R; 323/328

[56] References Cited

U.S. PATENT DOCUMENTS

| | | | |
|---|---|---|---|
| 2,738,464 | 3/1956 | Abbelt | 333/131 |
| 3,109,998 | 11/1963 | Petts III, et al. | 333/119 |
| 3,586,871 | 6/1971 | Seidel | 333/100 X |
| 3,883,829 | 5/1975 | Seidel | 333/119 |
| 4,190,816 | 2/1980 | Moss et al. | 333/131 |

Primary Examiner—Eugene R. LaRoche
Assistant Examiner—Benny Lee
Attorney, Agent, or Firm—Tarolli, Sundheim & Covell

[57] ABSTRACT

A signal dividing network is provided as an RF splitter for use in supplying N load devices of varying impedances with RF signals such that each of the N signals is of essentially the same magnitude and phase. The splitter includes a plurality of step-down auto transformers, each having a primary and a secondary defining a series circuit between a common RF source and ground. An output terminal is defined as the midpoint of the primary and secondary windings on each transformer and the output terminals are connected together in common whereby all of the primary windings are connected in parallel and all of the secondary windings are in parallel. Each output terminal has several outputs connected thereto such that the splitter has a total of N outputs for driving N load devices.

8 Claims, 4 Drawing Figures

RF SPLITTER CIRCUIT

BACKGROUND OF THE INVENTION

This invention relates to the art of power dividing, or splitting, and combining networks for splitting or combining high frequency signals.

Although the invention will be described herein with particular reference as an RF splitter for use in conjunction with a modulator circuit within an RF transmitter, it is to be appreciated that the invention has broader applications and may be used in other areas such as in high fidelity audio and public address systems as either a high frequency splitter or a combiner.

In most prior art RF splitters, the phase and amplitude of the output signals vary substantially with variations in load impedance. For example, if an RF splitter be used for driving a plurality of MOSFET transistor amplifiers in a medium wave AM broadcast transmitter, the input impedance of one amplifier with its associated circuitry can differ from another amplifier by about 20%. With most RF splitters, if the impedance changes on the order of 20%, the voltage changes on the order of about 20%. It has been found that in order to obtain good efficiency, the voltage balance should be within 5% for class D MOSFET amplifiers.

It has been known in the prior art that a simple RF splitter having a small number of outputs, such as four, may well provide output signals having essentially equal amplitude and phase signals. However, if the number of outputs becomes large, as in a high power solid state transmitter operating on the order of 1 kilowatt, the outputs cannot physically tie to a point because the point becomes a stack or an area. The impedance of the drive circuit at some frequencies may be very low. The input impedance of switching type MOSFET transistors varies a large amount across the broadcast band. Unless all of the outputs originate from a point or a region that acts essentially as a point, the signals will not be equal with unequal loads.

It is therefore desirable that an RF splitter for such an application drive a plurality of N outputs from what appears to act as if each output came from essentially a point source.

Also, individual transformers may be constructed which are approximately ideal and with each having a fairly high transformation. In this case, each output may act as if it comes from a point source. However, constructing N transformers wherein each has a high turns ratio would be quite difficult and expensive.

It is therefore desirable that an RF splitter function similar to N ideal transformers but employing a transformer construction wherein all the windings are on a single core. In such case, the secondary windings may all be in parallel. In an actual implementation, the primary winding may be uniformly wound around a ferrite core to maintain a constant flux density around the core. Consequently, the voltage induced in the secondary is constant around its diameter.

Prior art examples of similar constructions include the U.S. Pat. No. 4,190,816 to Moss. This is a splitter which divides a high frequency signal into N output signals of the same power and phase. However, the output ports are not electrically connected in common. No disclosure is presented as to how each of the output ports may be used to provide a plurality of outputs.

The U.S. Pat. No. 2,738,464 to Abbett, is another teaching of employing transformer couplings, in this case as an RF voltage divider circuit. The couplings are tightly wound transformer elements. However, there is no teaching of a system wherein all of the outputs are commonly connected.

SUMMARY OF THE INVENTION

It is an object of the present invention to provide a network usable as an RF splitter which will provide essentially identical full amplitude and phase signals to a large number of outputs which may present unequal loads.

It is a still further object of the present invention to provide such a device that will drive N outputs from what acts as if each output originated from essentially the same point source.

It is a still further object to provide such a device which functions similar to N ideal transformers but is accomplished with all the windings being on the same core and the secondary windings being connected in parallel.

The foregoing and other objects of the invention are obtained with a network employing a structure wherein an RF input signal is supplied to a plurality of S primary windings, each wound about the same core and terminating at an output terminal to which T outputs are connected. The output terminal points are all connected together in electrical common and the terminal points are connected to ground by way of S secondary windings. This, then, feeds N output circuits where N equals ST.

Still further in accordance with the present invention the device includes a pair of spaced apart coplanar plates interconnected by means of a metal centrally located spool or pipe. A toroidal core is located between the plates and coaxially surrounds the metal spool. Each of the S primary windings is wound about the toroidal core with one end of the winding being connected to an RF source and the other end being connected to a terminal point located on one of the plates. Each terminal point is, in turn, adapted to be connected to T output circuits so that the total number of output circuits N is equal to ST. The secondary for each primary winding is completed by a flux path extending through the plates and the central spool.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

The invention herein as applied to an RF splitter device is intended to be employed for purposes of providing essentially equal amplitude and phase outputs for a large plurality of output circuits. This is done in a manner such that the amplitude and phase of the output signal is nearly constant with large variations in loading.

Figure 1:
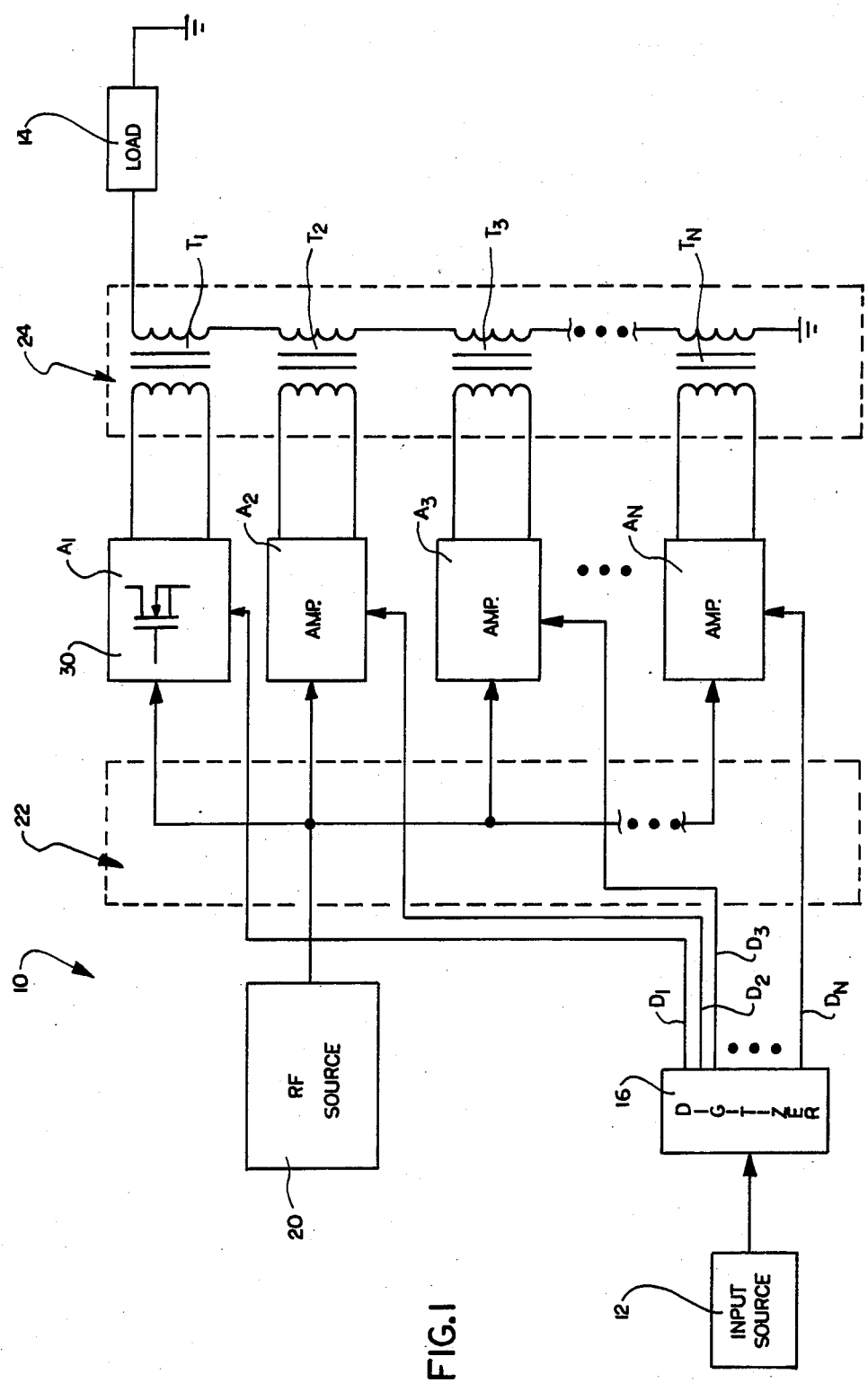
FIG. 1 is a schematic-block diagram of one application to which the present invention may be applied.

One application of the invention as applied to splitting devices is used in conjunction with driving MOSFET transistors in a medium wave AM broadcast band (on the order of 500 to 1600 KHz). An example of such an application is illustrated in FIG. 1, to which reference is now made. The example takes the form of a digital amplitude modulator such as that illustrated and described in my previously filed U.S. application Ser. No. 334,083, filed Dec. 24, 1981, now U.S. Pat. No. 4,580,111, and entitled "Digital Amplitude Modulator", and which is assigned to the same assignee as the present invention. Such a modulator is particularly useful as a high powered amplitude modulator for use in AM radio or TV broadcasting.

Referring now to FIG. 1, the amplitude modulator 10 is illustrated as receiving an input signal from input source 12 which may be the source of an audio or video signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. As brought out in my aforesaid application, a digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $A_1$–$A_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided as its output. Each power amplifier has an input connected to a single common RF source 20. The RF source 20 serves as the single source of an RF carrier signal which is supplied by way of an RF splitter 22 so that each amplifier $A_1$–$A_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers $T_1$, $T_2$, $T_3$, ..., $T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

Each of the amplifiers $A_1$–$A_N$ takes the form of class D MOSFET transistor amplifier. In FIG. 1, amplifier A1 is schematically illustrated as including a MOSFET transistor 30 which effectively acts as a switch so that when gated into conduction by an input signal, a path is completed between its source and drain electrodes. Preferably, in the application being described, the MOSFET transistors are connected in a bridge circuit. Such a circuit as illustrated in FIG. 1 is illustrated and described in detail in my aforesaid application and is employed in a medium wave AM broadcase band. The input impedance of one MOSFET transistor amplifier A1 may differ from that of another amplifier, such as A3, by approximately 20%. It has been found that in order to have good efficiency of operation, the voltage balance should be held within 5% for class D MOSFET transistor amplifiers.

In accordance with the present invention, the RF splitter 22 is constructed so as to provide essentially identical equal amplitude and phase signals for each of the amplifiers $A_1$–$A_N$. This is achieved such that the RF splitter will effectively drive N outputs or amplifiers from what appears as if each output originated from essentially the same point source. Whereas only four amplifier stages are illustrated in FIG. 1, it is contemplated that N may be on the order of 96, for example.

Figure 2:
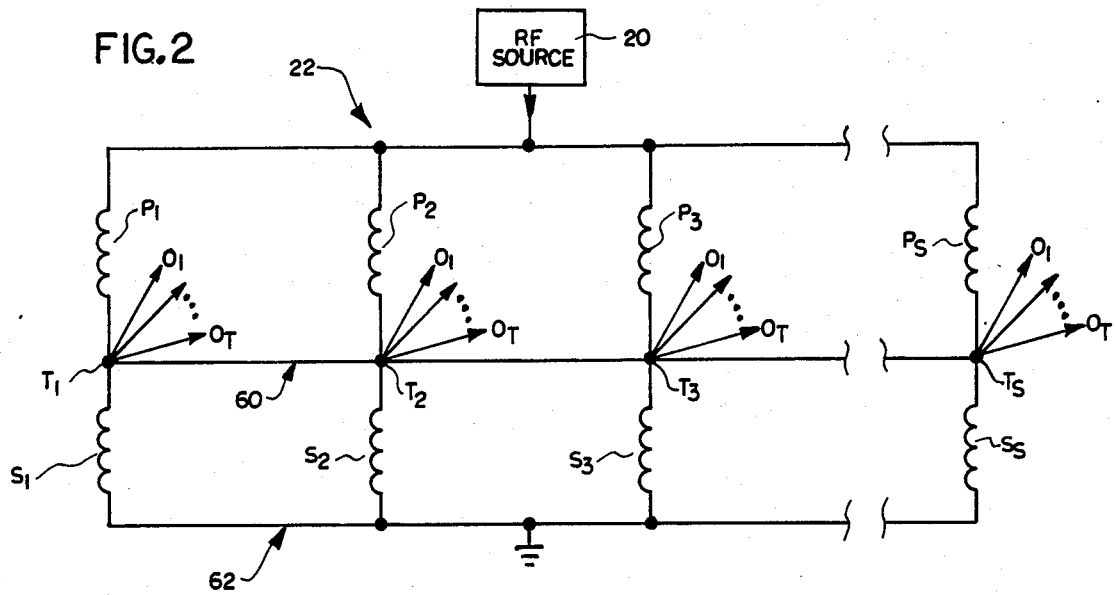
FIG. 2 is a schematic illustration of the circuit of the preferred embodiment of the invention.
Figure 3:
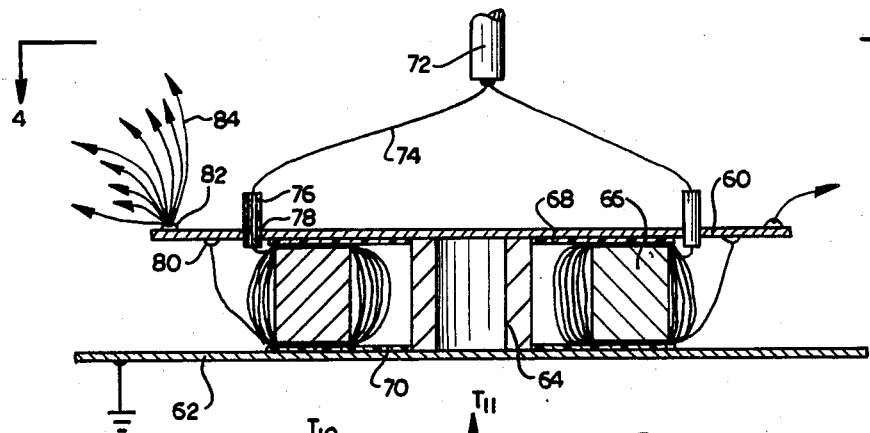
FIG. 3 is an elevational view partly in section showing the mechanical construction of the preferred embodiment of the invention.
Figure 4:
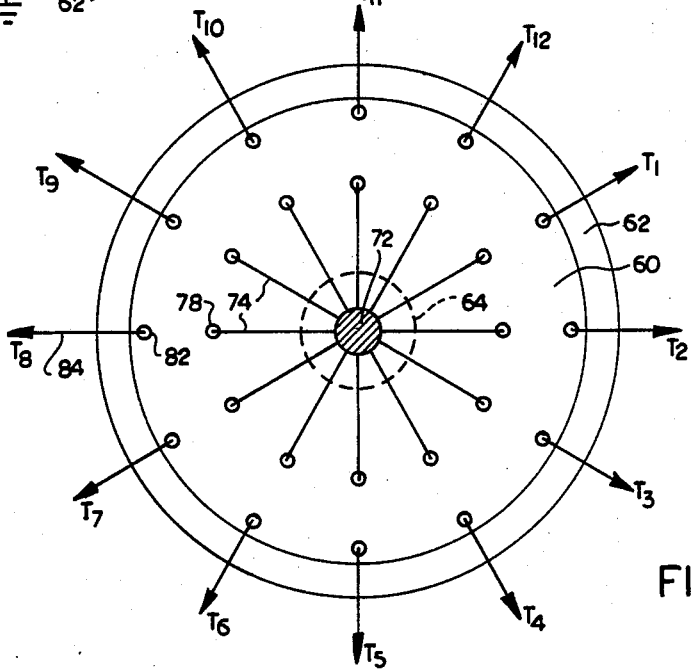
FIG. 4 is a view taken generally along line 4—4 looking in the direction of the arrows in FIG. 3.

The RF splitter 22 is illustrated in greater detail in FIGS. 2-4 to which attention is now directed. FIG. 2 is an equivalent schematic circuit diagram and FIGS. 3 and 4 illustrate the mechanical construction.

Referring now to FIG. 2, there is illustrated the equivalent electrical circuit of the RF splitter 22 and which includes a plurality of step-down transformers having a primary to secondary ratio of 4:1. There are S primary windings $P_1$–$P_S$ all connected together in parallel and receiving an input from the single common RF source 20. The secondary windings $S_1$–$S_S$ are also connected in parallel between a terminal point and ground. There are S terminal points $T_1$–$T_S$. Each terminal point has T outputs $O_1$–$O_T$ where N equals ST. In one example of the invention, twelve transformers are employed, each having eight outputs and, hence, in this example S=12 and T=8 so that N (the number of output circuits being fed by the spliiter )=96.

As shown in FIGS. 3 and 4, the RF splitter takes the form of a pair of spaced coplanar circular-shaped copper plates including an upper plate 60 and a lower plate 62 separated by and secured together by means of a copper center spool or pipe 64. The plates are suitably secured to the pipe as by brazing or a suitable conductive adhesive or the like.

In one embodiment of the invention, the lower plate 62 has a diamter on the order of 6 inches and the upper plate 60 has a diameter on the order of 5 inches and each has a thickness on the order of ⅛ inch. The center pipe 64, which is essentially aligned to the plates, has a diameter on the order of 3 inches. A toroidal core 66, preferably of ferrite material, is lcoated intermediate plates 60 and 62 and coaxially surrounds pipe 64. Core 66 has an internal diameter on the order of 3½ inches and an external diameter on the order of 4 inches. The toroidal core and the windings thereon are separated from plates 60 and 62 by means of a pair of insulator disc plates 68 and 70.

A conductive lead 72 is connected to the RF source 20 and is provided with a manifold connection to the RF splitter in such a manner as to provide 12 input conductors 74 each located in an insulator sleeve 76. The insulator sleeve of each conductor extends through an aperture 78 in a circular array of apertures in the upper plate 60. The conductor within each insulated sleeve is then wrapped about core 66 with the requisite number of turns, to form one of the primary windings, with the terminal end of the conductor then being secured to the underside of the copper plate 60 as by a suitable weld 80 or the like. On the upper side and associated with weld 80 there is provided an output terminal 82 to which there is connected eight output leads 84 each serving to drive one RF amplifier. The twelve output terminals 82 correspond with output terminals $T_1$-$T_S$ of the schematic diagram of FIG. 2. Each output terminal has an associated group of eight conductors 84. Each group of conductors corresponds with each group of output leads $O_1$-$O_T$ of the circuit diagram of FIG. 2.

The lower copper plate 62 is connected to electrical ground and in its application this plate may be bolted directly to a transmitter chassis which, in turn, is grounded. Electrically, each secondary winding $S_1$-$S_S$ is defined in the mechanical construction in FIGS. 3 and 4 by a path from ground, through lower plate 62, around the toroidal core by way of the copper pipe 64 through the upper plate 60, out to the terminals 82 to the load and back to ground.

A 50 kilowatt transmitter has been constructed in accordance with the circuitry and mechanical configuration as described herein. In that construction, the primary windings are uniformly wound around a ferrite core to maintain a constant flux density around the core. The voltages induced in the secondary are constant around its diameter. With all of the transformers being wound as 4:1 step-down auto transformers, all of the outputs were found to be within 1% amplitude and 1% phase of each other. The splitter functions similar to a plurality of N ideal transformers with N outputs for feeding N RF amplifiers. Thus, the splitter's N outputs appear as if each originated from the same point source.

Whereas the invention has been described in conjunction with a preferred embodiment, it is to be noted that various modifications may be made without departing from the spirit and scope of the invention as defined by the appended claims.

Having described a specific preferred embodiment of the invention, the following is claimed:

1. A signal splitter for supplying N load devices of varying impedances with N signals such that each of the N signals is of essentially the same magnitude and phase, said splitter including:

a plurality of S step-down transformers, each transformer having a primary winding and a secondary winding which is series connected between a common signal source and ground, each said transformer having an output terminal located at the junction interconnecting its primary and secondary windings, each junction being interconnected together in common with the other junctions such that all of said primary windings are in parallel to each other and all of said secondary windings are in parallel to each other, each said junction providing an output terminal having T outputs connected thereto so that said splitter has N total outputs, where N=ST, for driving N load devices.

2. A signal splitter as set forth in claim 1 wherein said plurality of transformers comprises a common magnetic core and wherein each said primary winding comprises a conductor wound about said common core.

3. A signal splitter as set forth in claim 2 wherein said core is an annular toroidal core.

4. A signal splitter as set forth in claim 3 including first and second conductive members axially disposed on opposite sides of said toroidal core, and a third conductive member connecting said first and second conductive members and extending through the center of said toroidal core.

5. A signal splitter as set forth in claim 4 wherein said first and second conductive members are each of generally planar configuration with said toroidal core sandwiched therebetween.

6. A signal splitter as set forth in claim 4 wherein each said primary winding has one end connected to said common signal source and has its other end connected to a respective said output terminal.

7. A signal splitter as set forth in claim 6 wherein each said output terminal is located on said first conductive member whereby all of said output terminals are connected in common at said junctions by said first conductive member.

8. A signal splitter as set forth in claim 7 wherein each said secondary winding is defined by a path around said core and said path includes said first, second and third conductive members.

* * * * *